US008242666B2

(12) United States Patent
Yamada

(10) Patent No.: US 8,242,666 B2
(45) Date of Patent: Aug. 14, 2012

(54) CONTOUR RESONATOR AND METHOD FOR ADJUSTING CONTOUR RESONATOR

(75) Inventor: Akinori Yamada, Ina (JP)

(73) Assignee: Seiko Epson Corporation, Tokyo (JP)

( * ) Notice: Subject to any disclaimer, the term of this patent is extended or adjusted under 35 U.S.C. 154(b) by 436 days.

(21) Appl. No.: 12/528,550

(22) PCT Filed: Feb. 18, 2008

(86) PCT No.: PCT/JP2008/000247
§ 371 (c)(1),
(2), (4) Date: Aug. 25, 2009

(87) PCT Pub. No.: WO2008/105145
PCT Pub. Date: Sep. 4, 2008

(65) Prior Publication Data
US 2010/0096951 A1  Apr. 22, 2010

(30) Foreign Application Priority Data

Feb. 26, 2007  (JP) ................................. 2007-045057
Nov. 8, 2007  (JP) ................................. 2007-290450

(51) Int. Cl.
*H01L 41/06* (2006.01)
(52) U.S. Cl. ..................... 310/361; 310/312; 310/346
(58) Field of Classification Search .................. 310/312, 310/346, 361
See application file for complete search history.

(56) References Cited

U.S. PATENT DOCUMENTS

| 2,227,904 | A | * | 1/1941 | Hight | 310/355 |
| 3,573,672 | A | * | 4/1971 | Fair et al. | 333/191 |
| 4,259,607 | A | * | 3/1981 | Noguchi et al. | 310/364 |
| 5,233,261 | A | * | 8/1993 | Wajid | 310/364 |
| 6,707,234 | B1 | | 3/2004 | Kawashima | |
| 7,019,605 | B2 | | 3/2006 | Larson, III | |
| 7,408,428 | B2 | * | 8/2008 | Larson, III | 333/187 |
| 7,424,772 | B2 | | 9/2008 | Larson, III | |
| 7,579,762 | B2 | * | 8/2009 | Takahashi | 310/364 |

FOREIGN PATENT DOCUMENTS

| CN | 2109663 U | 7/1992 |
| CN | 1902819 A | 1/2007 |
| JP | U-54-25085 | 2/1979 |
| JP | A-2004-135357 | 4/2004 |
| JP | A-2005-94733 | 4/2005 |
| JP | A-2006-186462 | 7/2006 |
| JP | 2008-199438 A * | 2/2007 |

OTHER PUBLICATIONS

Kawashima et al, *Lame-Mode Quartz-Crystal Resonator Formed by an Etching Process*, Symposium, May 1995, Chiba-shi, Japan.
Mizumoto et al, *Development of a Small-Sized Lame-mode Quartz-Crystal Resonators*, Symposium, May 2006, Tokyo, Japan.
International Search Report issued in International Application No. PCT/JP2008/000247 on May 20, 2008.

* cited by examiner

*Primary Examiner* — Thomas Dougherty
(74) *Attorney, Agent, or Firm* — Oliff & Berridge, PLC

(57) ABSTRACT

A contour resonator is provided with a vibrating body formed from a flat plate in a square shape, excitation electrodes formed on both front and back surfaces of the vibrating body and regulating a resonance frequency, and temperature characteristic adjustment films formed on surfaces of the excitation electrodes and adjusting a temperature characteristic.

12 Claims, 5 Drawing Sheets

[Fig. 1]
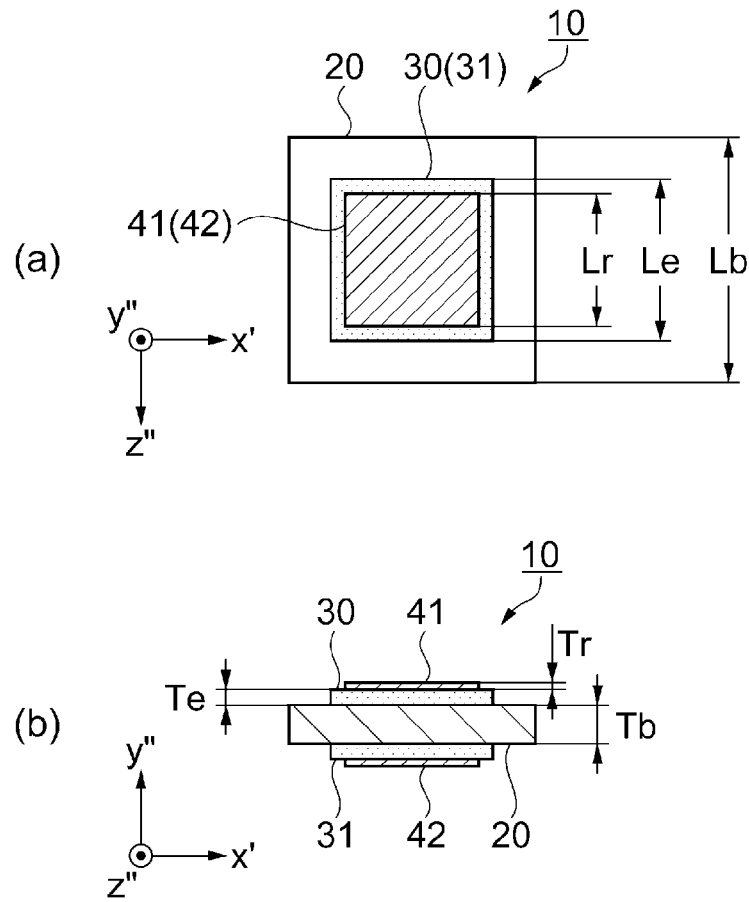
[Fig. 2]
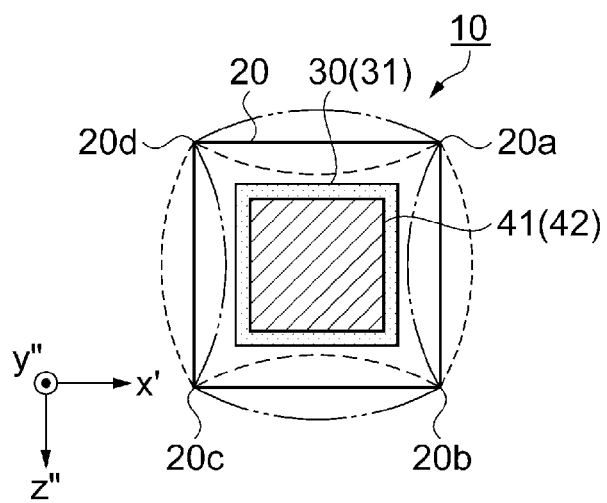

[Fig. 3]
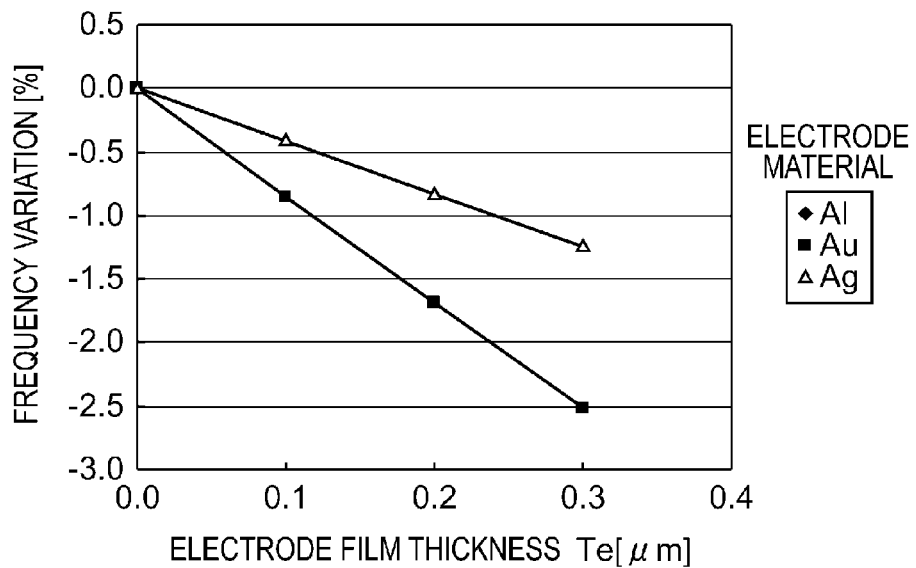
[Fig. 4]
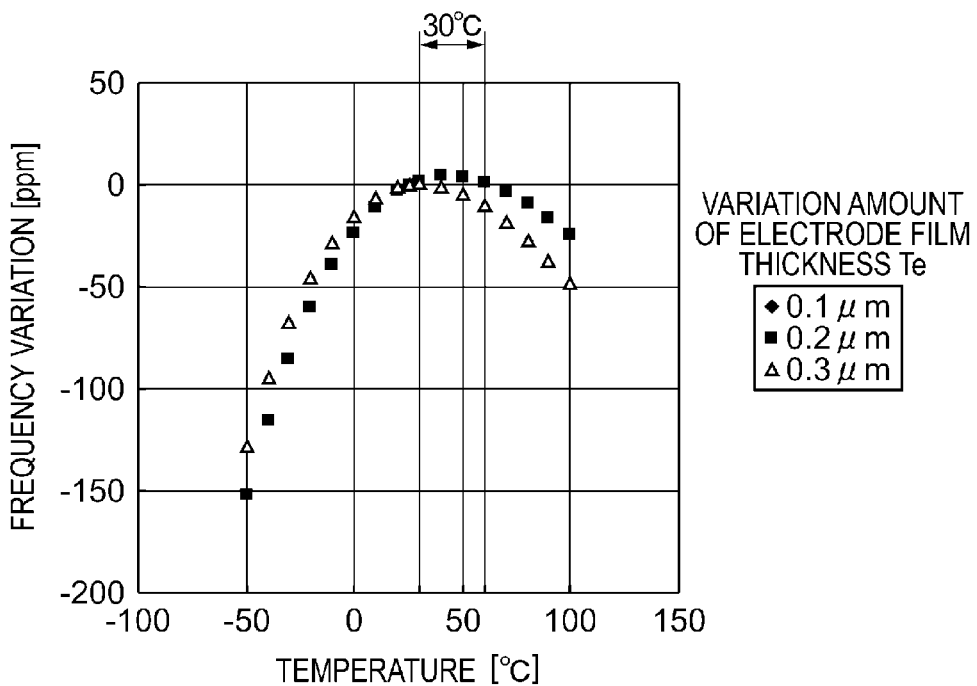

[Fig. 5]
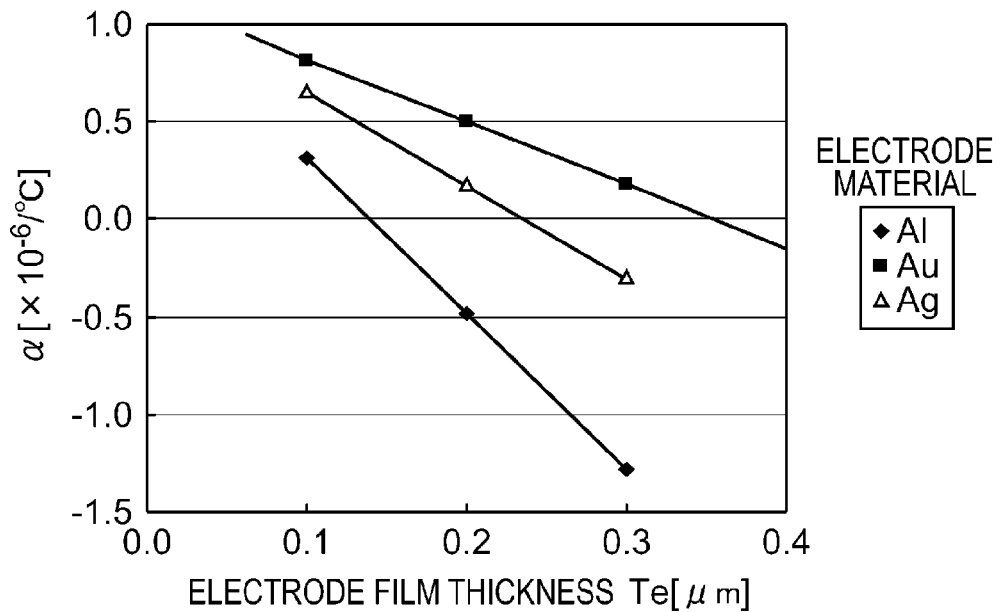
[Fig. 6]
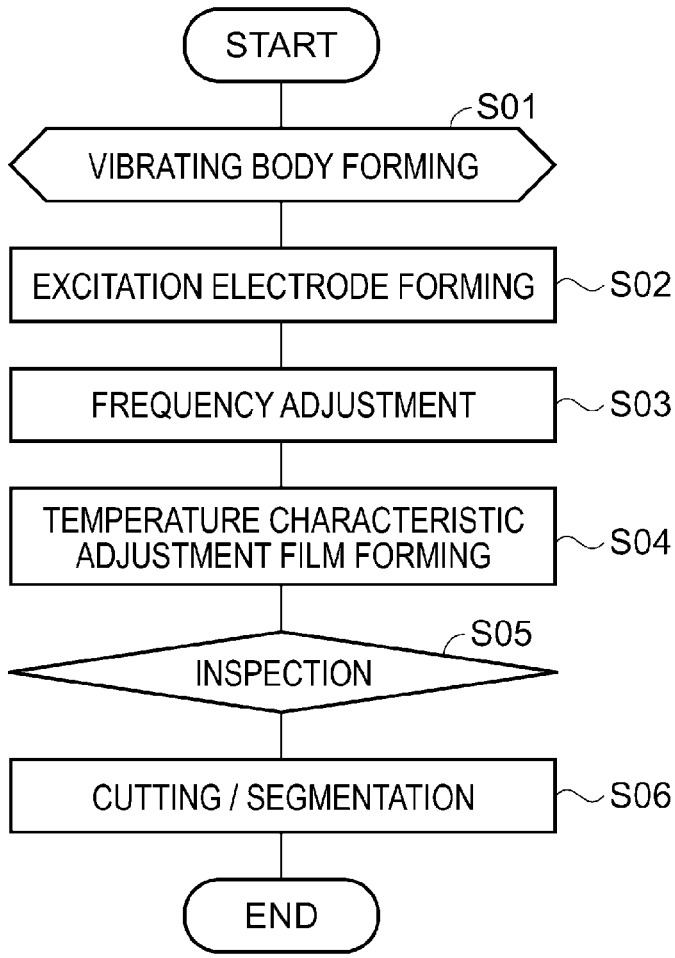

[Fig. 7]
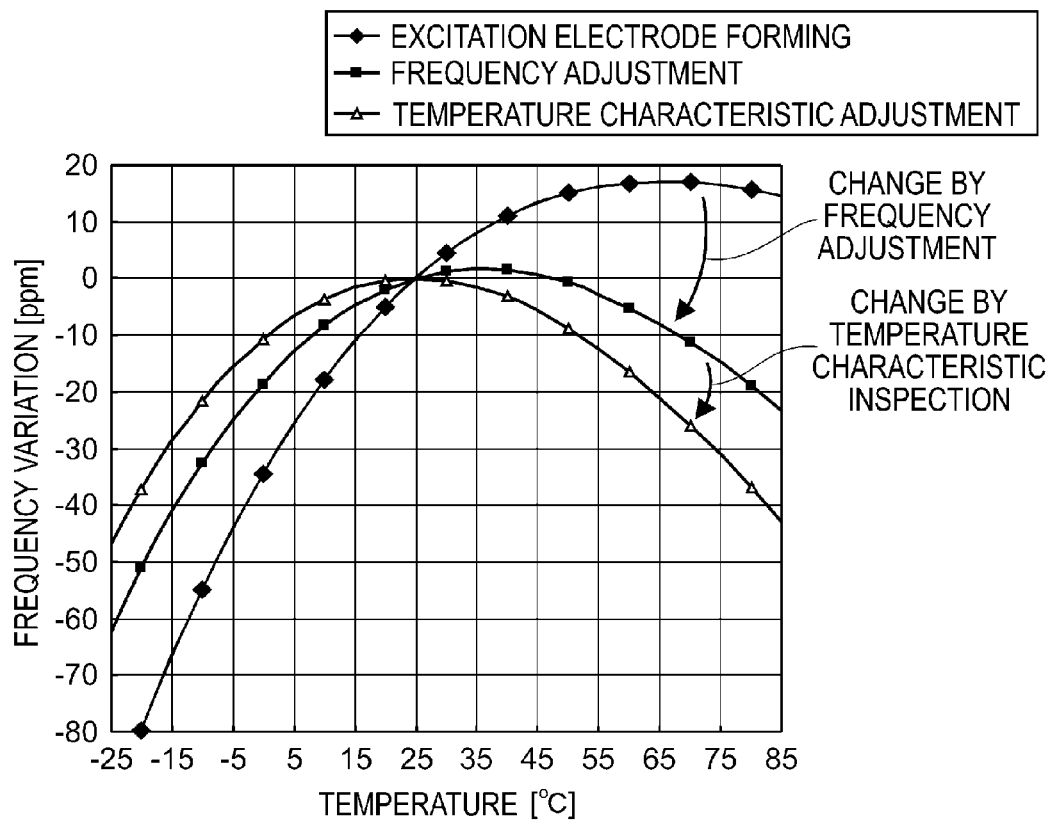
[Fig. 8]
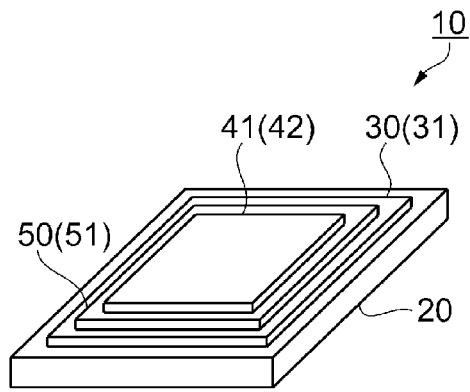

[Fig. 9]
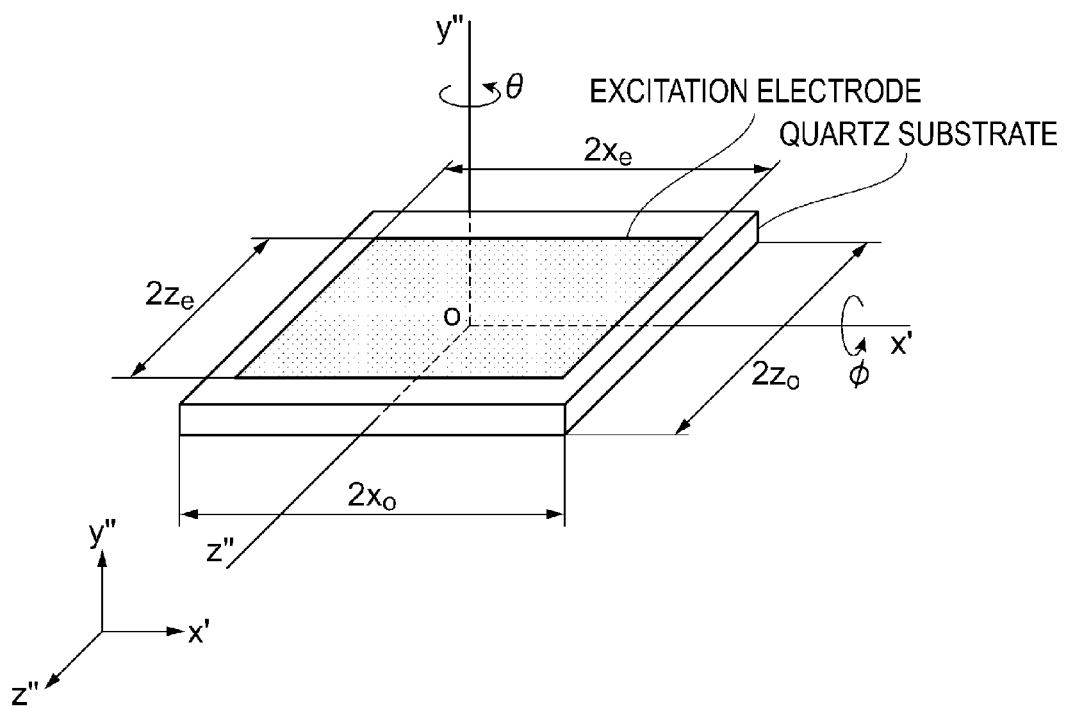

CONTOUR RESONATOR AND METHOD FOR ADJUSTING CONTOUR RESONATOR

TECHNICAL FIELD

The present invention relates to a contour resonator including a temperature characteristic adjustment film formed on a surface of an excitation electrode and adjusting a temperature characteristic only, and a method for adjusting the contour resonator.

BACKGROUND ART

A reference signal source in a several MHz frequency band used for electronic devices such as a portable device, an information communication device, and a measuring device includes: an AT cut quartz crystal resonator; a DT cut quartz crystal resonator (a contour shear mode quartz crystal resonator); and a contour resonator such as a Lame mode quartz crystal resonator and a quasi Lame mode quartz crystal resonator.

Conventionally, as a frequency adjustment for a contour resonator, a method to adjust a resonance frequency by sputtering a metal film of a vibrating portion using atomic particles and/or molecular particles, or ion particles, and a method to adjust a resonance frequency by attaching a metal film to the vibrating portion have been employed (e.g. refer to Patent Citation 1).

Further, Non Patent Citation 1 shows that in a Lame mode quartz crystal resonator indicated by YX1t phi/theta of IRE (abbreviation of Institute of Radio Engineers, that is, current IEEE) standard, a resonance frequency (contour vibration frequency) f of an individual quartz substrate is derived by a frequency equation shown in Math (9) in the citation. In addition, by this frequency equation, a resonance frequency of an individual excitation electrode can also be derived. This is also shown in Non Patent Citation 2.

Patent Citation 1: Japanese Unexamined Patent Publication No. 2005-94733 (page 23, FIG. 5)

Non Patent Citation 1: "Lame-mode quartz-crystal resonator formed by an etching method" by Hirofumi Kawashima, and Masaru Matsuyama in the 24th EM symposium, page 11 to 16, Math (2), conditional clause and Math (9)

Non Patent Citation 2: "Development of a small-sized Lame-mode quartz-crystal resonator" by Katsuya Mizumoto, Masashi Akino, Tsuyoshi Nishizuka, Hideki Ashizawa, Masahide Marumo, and Masato Amemiya in the 35th EM symposium, page 31 to 34

DISCLOSURE OF INVENTION

Technical Problem

In a method for adjusting a resonance frequency of a contour resonator according to Patent Citation 1 as above, a metal film of a vibrating portion is sputtered or attached to change a thickness or an area of the metal film, so that the resonance frequency is adjusted. However, this method has an issue in which a desired temperature characteristic is not obtained because the temperature characteristic is also changed in accordance with the resonance frequency by changing the thickness or the area of the metal film.

The present invention aims to provide a contour resonator having a desired resonance frequency and a desired temperature characteristic, and a method for adjusting this contour resonator.

Technical Solution

A contour resonator of the invention characterized by including a vibrating body formed from a flat plate made of quartz crystal and having a square shape in a plan view, an excitation electrode formed on both front and back surfaces of the vibrating body and regulating a resonance frequency, and a temperature characteristic adjustment film formed on at least one surface of the excitation electrode and adjusting a temperature characteristic.

According to the invention, the resonance frequency is adjusted by increasing or decreasing a thickness or an area of the excitation electrode, and the temperature characteristic adjustment film is formed on the surface of the excitation electrode, enabling adjustment of the temperature characteristic of the contour resonator without affecting the resonance frequency.

Further, when the resonance frequency of the vibrating body is a desired frequency, it is preferable that a resonance frequency Fr of the temperature characteristic adjustment film be nearly equal to a resonance frequency Fb of the vibrating body.

This enables the temperature characteristic adjustment film to be set in an appropriate dimension without changing the resonance frequency. And if the dimension is set this way, only the temperature characteristic can be adjusted without changing the resonance frequency even when a thickness of the temperature characteristic adjustment film is changed.

Further, when the resonance frequency of the vibrating body is a desired frequency, it is preferable that the resonance frequency Fr of the temperature characteristic adjustment film be nearly equal to the resonance frequency Fb of the vibrating body, and a resonance frequency Fe of the excitation electrode.

The resonance frequency Fb of the vibrating body nearly equals the resonance frequency Fe of the excitation electrode, enabling a dimension of the excitation electrode that can minimize a change of the resonance frequency caused by adding the excitation electrode to be set. In addition, this can be adaptable by corresponding to a material used for the excitation electrode. Furthermore, to make Fr nearly equal to Fb, and Fb nearly equal to Fe enables adjustment of the temperature characteristic while suppressing variation of the resonance frequency in accordance with variation of thicknesses of the excitation electrode and the temperature characteristic adjustment film that are added to the vibrating body.

Further, it is preferable that the resonance frequency Fr of the temperature characteristic adjustment film be nearly equal to a desired resonance frequency F0 of the contour resonator.

In a case where the resonance frequency Fb of the new conductor is different from the desired resonance frequency, this enables the temperature characteristic adjustment film to be set in an appropriate dimension that cannot fluctuate the resonance frequency of the contour resonator after a frequency adjustment process to obtain the desired resonance frequency. And if the dimension is set this way, only the temperature characteristic can be adjusted without changing the resonance frequency even when the film thickness of the temperature characteristic adjustment film is changed.

Further, it is desirable that an intermediate layer be formed between the temperature characteristic adjustment film and the vibrating body. As above, if conditions of the invention described above are satisfied even when the intermediate layer is formed, the temperature characteristic is adjustable without affecting the resonance frequency of the vibrating body. This presents that the temperature characteristic adjustment film may be a stacked body with the intermediate layer.

Further, a method for adjusting a contour resonator according to the invention is characterized by including a process to form a vibrating body formed from a flat plate made of quartz crystal and having a square shape in a plan view, a process to form an excitation electrode on both front and back surfaces of the vibrating body, a process to adjust a resonance frequency by changing at least one of a thickness and an area of the excitation electrode, and a process to adjust a temperature characteristic by forming a temperature characteristic adjustment film on at least one surface of the excitation electrode. Preferably, a resonance frequency Fr of the temperature characteristic adjustment film may be nearly equal to a resonance frequency Fb of the vibrating body, and more preferably, Fr may be nearly equal to Fb, and Fb may be nearly equal to a resonance frequency Fe of the excitation electrode. Further, it is desirable that an intermediate layer be formed between the temperature characteristic adjustment film and the vibrating body.

According to the invention, the resonance frequency is adjusted by increasing or decreasing a thickness or an area of the excitation electrode, and only the temperature characteristic can be adjusted by forming the temperature characteristic adjustment film, so that the contour resonator having the desired resonance frequency and temperature characteristic can be easily produced.

BEST MODE FOR CARRYING OUT THE INVENTION

A mode for the present invention will now be described with reference to the accompanying drawings.

FIGS. 1 through 7 show a contour resonator according to a mode for the invention 1, and FIG. 8 shows a modification example of the mode for the invention 1, while FIG. 9 shows a Lame-mode quartz-crystal resonator regarding Non Patent Citation 1.

MODE FOR THE INVENTION 1

FIG. 1 schematically shows the contour resonator according to the mode for the invention 1 of the invention. (a) is a plan view and (b) is a side view. In FIGS. 1(a) and 1(b), a contour resonator 10 is a Lame mode quartz crystal resonator including excitation electrodes 30 and 31 on both front and back sides of a vibrating body 20 in a square shape, and temperature characteristic adjustment films 41 and 42 on surfaces of the excitation electrodes 30 and 31. The vibrating body 20 is described by exemplifying an LQ2T cut quartz crystal that is cut out in a square plate having a cutting angle expressed by YX1t phi/theta of the IRE standard. Further, a case where each element is in a square shape in which a side length of the vibrating body 20 is Lb, and a side length of the excitation electrodes 30 and 31 is Le, while a side length of the temperature characteristic adjustment films 41 and 42 is Lr is exemplified.

For the excitation electrodes 30 and 31, metal materials such as Al, Au, Ag, Cu, Pd, and Ni can be used. However, Pd and Ni have electrical resistivity about four times as large as that of Al, Au, Ag, and Cu, so that a sheet resistance of the excitation electrodes 30 and 31 increases, increasing a resistance loss. Thus it is not practically preferable to use Pd and Ni in a single layer. Therefore, in this mode for the invention, Al, Au, and Ag having low resistivity are described as examples.

Further, although a material for the temperature characteristic adjustment films 41 and 42 is not limited, a metal material such as Al, Au, Ag, Cu, Pd, and Ni is preferable, and a nonmetallic material is also possible. Furthermore, the material can be either same as or different from that of the excitation electrodes.

Next, driving of the contour resonator 10 will be described.

FIG. 2 is an explanatory diagram schematically showing the driving of the contour resonator. If an excitation signal is applied to the excitation electrodes 30 and 31 of the contour resonator 10, Lame mode vibration is excited. The Lame mode vibration has vibration nodes at four corners 20a to 20d of the vibrating body 20, and repeats an area vibration shown in a two-dot chain line and a dashed line. Therefore, though the illustration is omitted, a support beam is provided to some of the nodes at the four corners 20a to 20d. Then, a resonance frequency of this contour resonator 10 is affected by an area and a film thickness of the excitation electrodes 30 and 31.

Further, a frequency equation for evaluating a resonance frequency f of the Lame mode quartz crystal resonator is provided by Non Patent Citation 1 described above (Non Patent Citation 1, page 12, Math (9)).

FIG. 9 is a perspective view schematically showing the Lame-mode quartz-crystal resonator regarding Non Paten Citation 1.

[Math. 1]

$$f = \frac{m}{2(2x_o)}\sqrt{\frac{c'_{11} - c'_{13}}{\rho}} = \frac{n}{2(2z_o)}\sqrt{\frac{c'_{11} - c'_{13}}{\rho}} \quad (1)$$

Here, rho represents a density of quartz crystal, while $C'_{11}$ and $C'_{13}$ represent elastic constants (constant numbers obtained by converting elastic stiffness constants Cpq in accordance with Non Patent Citation 1 (page 11, conditional clause of Math (2)), and m=n=1. While $2x_0$ is a lateral side length of a quartz substrate (corresponding to the vibrating body 20 in this mode for the invention), $2z_0$ is a longitudinal side length. In addition, an individual resonance frequency of the excitation electrodes can also be evaluated by the same frequency equation. Further, the side length of the vibrating body 20 is indicated by Lb=$2x_o$=$2z_o$, and the side length of the excitation electrodes 30 and 31 is indicated by Le=2xe=2ze in the mode (refer to FIG. 9).

Furthermore, Math 1 shows that it satisfies even in a case where the vibrating body 20 and the excitation electrodes 30 and 31 are in rectangular shapes (even if the lateral side length is integral multiplication as large as the longitudinal side length, for example).

First, by using this frequency equation, a relation between the thickness of the excitation electrodes 30 and 31 and a change of the resonance frequency, and a change of a temperature characteristic will be described.

In the Lame-mode quartz-crystal resonator (LQ2T cut quartz crystal), when the side length Lb of the vibrating body 20 is 600 micrometers, a resonance frequency of about 4 MHz is obtained from Math 1. However, if variation in dimensional accuracy caused by variation in manufacturing is plus/minus 2%, the resonance frequency f will be shifted by about plus/minus 2% with respect to a desired resonance frequency. A case where this shifted amount of plus/minus 2% in the resonance frequency (amount of frequency variation) is adjusted by changing the thickness of the excitation electrodes 30 and 31 was tentatively evaluated by using FEM (Finite Element Method).

As evaluation conditions, quartz crystal cut out in LQ2T cut (in YX1t phi/theta of the IRE standard, when a cutting angle phi is −50 degrees, and a cutting angle theta is 45 degrees) including the vibrating body 20 in a square shape whose one side length Lb is 600 micrometers and thickness Tb is 50 micrometers, and the excitation electrodes 30 and 31 in a square shape whose one side length Le is 500 micrometers formed in each center of both front and back surfaces of the vibrating body 20 was formed. The results of the evaluation are shown in FIGS. 3 through 5. It is also described with reference to FIG. 1.

FIG. 3 is a graph showing the frequency variation (unit: %) when an electrode film thickness Te of each of electrode materials that are Al, Au, and Ag was changed. In FIG. 3, when the electrode material is Al, the frequency variation is small with respect to the electrode thickness Te. However, when the electrode material is Au or Ag, the frequency variation changes toward a minus side.

Further, FIG. 3 shows that when the electrode material is Au, the electrode film thickness Te of the excitation electrodes on the both front and back surfaces has to be adjusted by about 0.25 micrometers in order to correct the frequency variation of 2%. If the correction is performed to the excitation electrode on one side only, it has to be adjusted by about 0.5 micrometers. In a case of Ag, an amount for adjusting the electrode film thickness Te needs to be even larger.

Next, a change amount of the electrode film thickness Te and a frequency variation (unit: ppm) when a temperature is changed will be described.

FIG. 4 is a graph showing the frequency variation in accordance with a temperature change when the change amount of the electrode film thickness Te was 0.1 micrometers, 0.2 micrometers, and 0.3 micrometers. Note that FIG. 4 exemplifies a case where Au is employed as the electrode material. In FIG. 4, the frequency variation in accordance with the temperature change, that is, a curve of a second order showing the temperature characteristic moves by corresponding to the change amount of the electrode film thickness Te. When the adjustment amount of the electrode film thickness to correct the frequency variation of 2% in the example described above is 0.25 micrometers, it is found that a peak temperature is shifted by 30 degrees centigrade.

Results from this will be described by putting them into a relation of the electrode film thickness Te and a first-order temperature coefficient alpha.

FIG. 5 is a graph showing the relation between the electrode film thickness Te of each electrode material and the first-order temperature coefficient alpha when the electrode material is Al, Au, and Ag. FIG. 5 shows that the first-order temperature coefficient alpha changes in a minus direction in accordance with increase of the electrode film thickness Te of every electrode material.

That is, FIGS. 4 and 5 show that the resonance frequency is adjusted to be a desirable resonance frequency by changing the electrode film thickness Te, resulting in variation of a temperature characteristic indicated by a peak temperature and the first-order temperature coefficient alpha. Therefore, the temperature characteristic fluctuated by adding excitation electrodes are corrected to be in a desirable range of the temperature characteristic by forming the temperature characteristic adjustment films 41 and 42 without affecting the resonance frequency.

Subsequently, a method for adjusting the contour resonator 10 of the invention, specifically, a method for adjusting a resonance frequency and a temperature characteristic will be explained.

FIG. 6 is a process chart showing main processes for the method for adjusting the contour resonator. Further, FIG. 7 is a graph showing the temperature characteristic (indicating a frequency variation corresponding to a temperature change) in each process. It will be described with reference to FIGS. 6, 7, and 1. In FIG. 6, first, the vibrating body 20 is formed from a quartz substrate (quartz wafer) indicated by YX1t phi/theta of the IRE standard with a photolithography technique or the like (process S01). Although the illustration is omitted, the vibrating body 20 formed by arranging a plurality number of them on the quartz wafer includes a support beam and a base portion continuing to the support beam, and is connected to the quartz wafer by a support portion extending from the base portion.

The vibrating body 20 exemplified in this mode for the invention is in a square shape in which the cutting angle phi is −51.05 degrees, while the theta is 45 degrees, and the side length of the vibrating body Lb is 600 micrometers. In consideration of reduction of the first-order temperature coefficient alpha due to a frequency adjustment process S03 and a temperature characteristic adjustment film forming process S04 later, the cutting angle phi is preliminarily set to be larger than a desired first-order temperature coefficient alpha 0. Note that the desired first-order temperature coefficient alpha 0 is set to be 0, the peak temperature is 25 degrees centigrade, and a resonance frequency F0 is set to be 3.75872 MHz in this mode for the invention.

Subsequently, the excitation electrodes 30 and 31 are formed in a process S02. The excitation electrodes 30 and 31 are formed from Au as the electrode material on a whole of the both front and back surfaces of the vibrating body 20 by vapor deposition, sputtering, or the like so that the electrode film thickness Te is 0.1 micrometers. Hereinafter, the description is continued on the assumption that a resonance frequency F is 3.85614 MHz, and the first-order temperature coefficient alpha is $9.49*10^{-7}$/degrees centigrade are obtained at this time (refer to FIG. 7).

That is, the resonance frequency F when the excitation electrodes 30 and 31 of the vibrating body 20 were formed is 0.09742 MHz higher than the desired resonance frequency F0 (corresponding to plus 2.5%). The frequency adjustment is required for this increased amount of the resonance frequency.

Subsequently, the frequency adjustment is performed in the process S03 so as to obtain the desired resonance frequency. As the frequency adjustment, a method by increasing or decreasing the electrode film thickness Te, or a method by increasing or decreasing an electrode area can be employed. In this mode for the invention, since the resonance frequency is 0.09742 MHz higher than the resonance frequency Fb of the vibrating body, the electrode film thickness Te is added by 0.2 micrometers by vapor deposition or the like so as to be 0.3 micrometers, adjusting the resonance frequency so as to make the desired resonance frequency F0 be 3.75872 MHz.

At this time, the electrode film thickness Te is increased to adjust the frequency, changing the first-order temperature coefficient alpha to $3.18*10^{-7}$/degrees centigrade and the peak temperature to 35 degrees centigrade (refer to FIG. 7).

Subsequently, the temperature characteristic adjustment films 41 and 42 are formed so as to adjust the temperature characteristic (process S04). Each of the temperature characteristic adjustment films 41 and 42 is formed by Al in this mode for the invention and is set to have a dimension in which the resonance frequency Fr of the temperature characteristic adjustment film is nearly equal to the desired resonance frequency F0. If the resonance frequency of the vibrating body is the desired frequency, the dimension is set so as to be nearly equal to the resonance frequency Fb of the vibrating body. Accordingly, after the process S04 is completed, a relation should be that F0 is nearly equal to Fr (in a case where the resonance frequency of the vibrating body is the desired frequency, Fb is nearly equal to Fr). Even if the temperature characteristic adjustment films 41 and 42 are added, the resonance frequency does not change, but only the temperature characteristic changes. More specifically, F0 nearly equals Fr is that 0.995 multiplied by F0 is less than or equal to Fr, and 1.005 multiplied by F0 is more than or equal to Fr, while Fb nearly equals Fr is that 0.995 multiplied by Fb is less than or equal to Fr, and 1.005 multiplied by Fb is more than or equal to Fr. If these are satisfied, the change of the resonance frequency by adding the temperature characteristic adjustment films can be dramatically lessened.

Accordingly, as shown in FIG. 7, the contour resonator 10 after the process S04 is completed has the resonance frequency F that is 3.75872 MHz, the first-order temperature coefficient alpha that is 0, and the peak temperature of 25 degrees centigrade that is a temperature of the desired temperature characteristic in a condition in which the excitation electrodes 30 and 31 and the temperature characteristic adjustment films 41 and 42 are added.

Note that it is possible to use metal materials such as Al, Ag, Cu, and the like as the material of the excitation electrodes 30 and 31 other than Au. Further, it is possible to use nonmetal materials for the temperature characteristic adjustment films 41 and 42 other than Al or the metal materials such as Al, Ag, Cu, and the like. And either the same material as or different material from that of the excitation electrodes 30 and 31 can be used.

After the temperature characteristic adjustment (process S04), inspection on the resonance frequency F and the temperature characteristic is performed (process S05), and then segmentation (process S06) by cutting is performed so as to complete a single piece of the contour resonator 10.

Meanwhile, after the temperature characteristic adjustment, it is considered that a slight departure in the resonance frequency due to production tolerance is generated. In such a case, only a thickness of an exposed portion of the excitation electrodes 30 and 31 can be adjusted, or a final adjustment of the resonance frequency can be performed by adding a process to eliminate an outer circumferential portion (area adjustment) or the like.

Therefore, according to the mode for the invention 1 described above, the resonance frequency is adjusted by adjusting the thickness and the area of the excitation electrodes 30 and 31, and the temperature characteristic adjustment films 41 and 42 are formed on the surfaces of the excitation electrodes 30 and 31, enabling adjustment of the temperature characteristic of the contour resonator 10 without affecting the resonance frequency.

Further, in a case where the resonance frequency of the vibrating body is the desired frequency, by arranging the resonance frequency Fr of the temperature characteristic adjustment films 41 and 42 and the resonance frequency Fb of the vibrating body 20 so that Fr nearly equals Fb, an appropriate dimension of the temperature characteristic adjustment films 41 and 42 to correspond to the material of the temperature characteristic adjustment films 41 and 42 and not to make the resonance frequency fluctuate can be arranged. Furthermore, to make Fr nearly equal to Fb enables adjustment of the temperature characteristic without affecting the resonance frequency even if the thickness of the temperature characteristic adjustment films 41 and 42 is changed.

Further, in a case where the resonance frequency of the vibrating body is the desired frequency, by arranging the resonance frequency Fr of the temperature characteristic adjustment films 41 and 42, the resonance frequency Fb of the vibrating body 20, the resonance frequency Fe of the excitation electrodes 30 and 31 so that Fr nearly equals Fb, and Fb nearly equals Fe, a dimension of the excitation electrodes minimizing the change of the resonance frequency caused by adding the excitation electrodes 30 and 31 can be arranged. In addition, this can be adaptable by corresponding to the material used for the excitation electrodes 30 and 31. Furthermore, to make Fr nearly equal to Fb, and Fb nearly equal to Fe enables adjustment of the temperature characteristic while suppressing variation of the resonance frequency in accordance with the variation of each thickness of the excitation electrodes added to the vibrating body and the temperature characteristic adjustment films. More specifically, Fr nearly equals Fb and Fb nearly equals Fe is that 0.995 multiplied by Fb is less than or equal to Fr, and 1.005 multiplied by Fb is more than or equal to Fr, while 0.995 multiplied by Fe is less than or equal to Fr, and 1.005 multiplied by Fe is more than or equal to Fr. If these are satisfied, the change of the resonance frequency caused by adding the temperature characteristic adjustment films can be dramatically lessened.

Further, by arranging the resonance frequency Fr of the temperature characteristic adjustment films 41 and 42, and the desired resonance frequency F0 so that Fr nearly equals F0, an appropriate dimension of the temperature characteristic adjustment films 41 and 42 to correspond to the material of the temperature characteristic adjustment films 41 and 42 and not to make the resonance frequency fluctuate can be arranged. Furthermore, to make Fr nearly equal to F0 enables adjustment of the temperature characteristic without affecting the resonance frequency even if the thickness of the temperature characteristic adjustment films 41 and 42 is changed.

In addition, in the method for adjustment according to the mode for the invention 1, the resonance frequency is adjusted by adjusting the thickness and the area of the excitation electrodes 30 and 31, and the temperature characteristic is adjusted to be desirable while eliminating an effect on the variation of the resonance frequency caused by the temperature characteristic adjustment films 41 and 42, so that the contour resonator 10 with high precision can be easily produced.

MODIFICATION EXAMPLE OF MODE FOR THE INVENTION 1

Subsequently, a modification example of the mode for the invention 1 will be described. The modification example is characterized by having an intermediate layer formed between a temperature characteristic adjustment film and an excitation electrode.

FIG. 8 is a perspective view schematically showing a contour resonator according to the modification example of the mode for the invention 1. In FIG. 8, the excitation electrodes 30 and 31 are formed on the both front and back surfaces of the vibrating body 20, and intermediate layers 50 and 51 are formed on the respective surfaces of the excitation electrodes 30 and 31, and the temperature characteristic adjustment films 41 and 42 are formed on respective surfaces of the intermediate layers 50 and 51.

The intermediate layers 50 and 51 are formed as stacked bodies of either the temperature characteristic adjustment films 41 and 42, or the excitation electrodes 30 and 31. Further, a configuration in which the intermediate layer is formed between the vibrating body 20 and the excitation electrodes 30 and 31 is possible, and the excitation electrodes 30 and 31 can also be stacked bodies (not illustrated).

As above, even when the intermediate layers 50 and 51 are formed, if the conditions in the mode for the invention 1 described above are satisfied, the temperature characteristic is adjustable by forming the temperature characteristic adjustment films 41 and 42 without changing the resonance frequency.

BRIEF DESCRIPTION OF THE DRAWINGS

FIG. 1 schematically shows a contour resonator according to a mode for the invention 1 of the invention, while (a) is a plan view and (b) is a side view.

FIG. 2 is an explanatory diagram schematically showing driving of the contour resonator according to the mode for the invention 1 of the invention.

FIG. 3 is a graph showing a frequency variation when an electrode film thickness of each electrode material is changed if the material of the excitation electrode is Al, Au, and Ag according to the mode for the invention 1 of the invention.

FIG. 4 is a graph showing a frequency variation in accordance with a temperature change when a change amount of the electrode film thickness according to the mode for the invention 1 of the invention is 0.1 micrometers, 0.2 micrometers, and 0.3 micrometers.

FIG. 5 is a graph showing a relation between the electrode film thickness of each electrode material and a first-order temperature coefficient alpha if the material of the excitation electrode is Al, Au, and Ag according to the mode for the invention 1 of the invention.

FIG. 6 is a process chart showing main processes of a method for adjusting the contour resonator according to the mode for the invention 1 of the invention.

FIG. 7 is a graph showing a temperature characteristic in each process according to the mode for the invention 1 of the invention.

FIG. 8 is a perspective view schematically showing a contour resonator according to a modification example of the mode for the invention 1 of the invention.

FIG. 9 is a perspective view schematically showing a Lame mode quartz crystal resonator according to Non Patent Citation 1.

EXPLANATION OF REFERENCE

10 Contour resonator
20 Vibrating body
30, 31 Excitation electrode
41, 42 Temperature characteristic adjustment film

The invention claimed is:

1. A contour resonator, comprising:
   a vibrating body formed from a flat plate made of quartz crystal and having a square shape in a plan view;
   an excitation electrode formed on both front and back surfaces of the vibrating body and regulating a resonance frequency; and
   a temperature characteristic adjustment film formed on at least one surface of the excitation electrode and adjusting a temperature characteristic,
   wherein a resonance frequency Fr of the temperature characteristic adjustment film is nearly equal to a resonance frequency Fb of the vibrating body.

2. The contour resonator according to claim 1, wherein the resonance frequency Fr of the temperature characteristic adjustment film is nearly equal to the resonance frequency Fb of the vibrating body, and the resonance frequency Fb of the vibrating body is nearly equal to a resonance frequency Fe of the excitation electrode.

3. The contour resonator according to claim 1, wherein the resonance frequency Fr of the temperature characteristic adjustment film is nearly equal to a desired resonance frequency F0 of the contour resonator.

4. The contour resonator according to claim 1, wherein an intermediate layer is formed between the temperature characteristic adjustment film and the vibrating body.

5. The contour resonator according to claim 1, wherein an intermediate layer is formed between the temperature characteristic adjustment film and the vibrating body.

6. The contour resonator according to claim 3, wherein an intermediate layer is formed between the temperature characteristic adjustment film and the vibrating body.

7. A method for adjusting a contour resonator, comprising:
   a process to form a vibrating body formed from a flat plate made of quartz crystal and having a square shape in a plan view;
   a process to form an excitation electrode on both front and back surfaces of the vibrating body;
   a process to adjust a resonance frequency by changing at least one of a thickness and an area of the excitation electrode; and
   a process to adjust a temperature characteristic by forming a temperature characteristic adjustment film on at least one surface of the excitation electrode,
   wherein a resonance frequency Fr of the temperature characteristic adjustment film is nearly equal to a resonance frequency Fb of the vibrating body.

8. The method for adjusting a contour resonator according to claim 7, wherein the resonance frequency Fr of the temperature characteristic adjustment film is nearly equal to the resonance frequency Fb of the vibrating body, and the resonance frequency Fb of the vibrating body is nearly equal to a resonance frequency Fe of the excitation electrode.

9. The method for adjusting a contour resonator according to claim 7, wherein an intermediate layer is formed between the temperature characteristic adjustment film and the vibrating body.

10. The contour resonator according to claim 2, wherein an intermediate layer is formed between the temperature characteristic adjustment film and the vibrating body.

11. The method for adjusting a contour resonator according to claim 7, wherein an intermediate layer is formed between the temperature characteristic adjustment film and the vibrating body.

12. The method for adjusting a contour resonator according to claim 8, wherein an intermediate layer is formed between the temperature characteristic adjustment film and the vibrating body.

* * * * *